United States Patent
Roubadia et al.

(10) Patent No.: US 7,126,432 B2
(45) Date of Patent: Oct. 24, 2006

(54) MULTI-PHASE REALIGNED VOLTAGE-CONTROLLED OSCILLATOR AND PHASE-LOCKED LOOP INCORPORATING THE SAME

(75) Inventors: Regis Roubadia, Vitrolles (FR); Sami Ajram, Marseilles (FR)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 11/183,346

(22) Filed: Jul. 18, 2005

(65) Prior Publication Data
US 2006/0197614 A1   Sep. 7, 2006

(30) Foreign Application Priority Data
Mar. 1, 2005   (FR) .................................. 05 02067

(51) Int. Cl.
*H03B 5/24* (2006.01)
*H03L 7/087* (2006.01)
*H03L 7/099* (2006.01)

(52) U.S. Cl. .............................. 331/57; 331/8; 331/11; 331/17; 331/34; 331/177 R (58) Field of Classification Search ............... 331/1 A, 331/8, 10–11, 17–18, 25, 34, 57, 177 R; 327/156–159
See application file for complete search history.

(56) References Cited

U.S. PATENT DOCUMENTS

| | | | |
|---|---|---|---|
| 4,733,200 A | 3/1988 | Ecklund et al. | 331/116 R |
| 4,761,616 A | 8/1988 | Ash | 331/107 A |
| 5,061,907 A | 10/1991 | Rasmussen | 331/57 |
| 5,115,212 A | 5/1992 | Fenk et al. | 331/117 R |
| 5,485,128 A | 1/1996 | Azuma | 331/135 |
| 5,495,205 A | 2/1996 | Parker et al. | 331/1 |
| 5,847,616 A | 12/1998 | Ng et al. | 331/57 |
| 6,148,052 A | 11/2000 | Bogdan | 375/375 |
| 6,188,291 B1 | 2/2001 | Gopinathan et al. | 331/45 |
| 6,353,368 B1 | 3/2002 | Iravani | 331/57 |
| 6,417,740 B1 | 7/2002 | Anh et al. | 331/48 |
| 6,466,100 B1 | 10/2002 | Mullgrav, Jr. et al. | 331/179 |
| 6,617,936 B1 | 9/2003 | Dally et al. | 331/57 |
| 6,621,360 B1 | 9/2003 | Xu et al. | 331/57 |
| 6,650,190 B1 | 11/2003 | Jordan et al. | 331/57 |
| 6,683,506 B1 | 1/2004 | Ye et al. | 331/57 |

(Continued)

FOREIGN PATENT DOCUMENTS

WO   WO03063337   7/2003

OTHER PUBLICATIONS

T.H. Lee et al., "Oscillator Phase Noise: A Tutorial", IEEE Journal of Solid-State Circuits, vol. 35, No. 3, Mar. 2000, pp. 326-336.

(Continued)

*Primary Examiner*—David Mis
(74) *Attorney, Agent, or Firm*—Schneck & Schneck; Thomas Schneck; Mark Protsik (57) ABSTRACT

A multi-phase realigned voltage-controlled oscillator (MRVCO) achieves phase realignment based on charge injection in the VCO stages with the injection amount proportional to the instantaneous phase error between the VCO output clock and a reference clock. The MRVCO may be incorporated as part of an implementation of a multi-phase realigned phase-locked loop (MRPLL). A separate phase detector, as well as a specific realignment charge pump, may be provided in the PLL for controlling the VCO. The VCO has lower phase modulation noise, so that the PLL has very large equivalent bandwidth.

13 Claims, 8 Drawing Sheets

U.S. PATENT DOCUMENTS

2002/0051509 A1* 5/2002 Lindner et al. ............. 375/376

OTHER PUBLICATIONS

F.M. Gardner, "Charge-Pump Phase-Lock Loops", IEEE Transactions on Communications, vol. Com-28, No. 11, Nov. 1980, pp. 1849-1858.

A. Hajimiri et al., "Jitter and Phase Noise in Ring Oscillators", IEEE Journal of Solid-State Circuits, vol. 34, No. 6, Jun. 1999, pp. 790-804.

N. Retdian et al., "Voltage Controlled Ring Oscillator with Wide Tuning Range and Fast Voltage Swing", 3rd IEEE, Asia-Pacific Conference on ASICS, Aug. 6-8, 2002, Taipei, Taiwan, 4 pages.

T. Pialis et al., "Analysis of Timing Jitter in Ring Oscillators Due to Power Supply Noise", 2003 IEEE Int'l Symposium on Circuits and Systems, May 25-28, 2003, Proceedings, vol. 1, pp. 681-684.

Website printout: "Low Phase Noise CMOS Ring Oscillator VCOs for Frequency Synthesis", R.J. Betacourt Zamora et al., SMIRC Laboratory, Stanford University, http:// www-smirc.stanford.edu, Jul. 27, 1998, 19 pgs.

* cited by examiner

MULTI-PHASE REALIGNED VOLTAGE-CONTROLLED OSCILLATOR AND PHASE-LOCKED LOOP INCORPORATING THE SAME

TECHNICAL FIELD

The present invention relates to voltage-controlled oscillator (VCO) circuits, especially those of the ring oscillator type, characterized by recurring phase realignment with respect to a reference signal. The invention also relates to phase-locked loops containing such a VCO as a component thereof.

BACKGROUND ART

In classical VCO structures, low-frequency phase modulation (PM) noise, or long-term jitter, is significant and cumulative. Phase-locked loop (PLL) circuits using this kind of VCO are able to correct this PM noise or jitter only up to a modulation frequency equal to that of the PLL bandwidth. At higher modulation frequencies, the PLL circuit stops regulating and so the PM noise is equal to or slightly higher than the intrinsic PM noise of the VCO. Reducing high frequency PM noise, short-term jitter, requires either a very large PLL bandwidth or a low noise VCO. Enlarging the PLL bandwidth is limited by the fact that the bandwidth cannot exceed about $\frac{1}{20}^{th}$ of the reference frequency, due to quantization noise. Hence, low noise VCO circuits are sought.

Phase realignment in a VCO circuit allows synchronizing its phase to that of a reference clock signal. In particular, the VCO clock edge may be resynchronized to each reference clock edge. This resynchronization has been realized by inserting realignment inverters having specific phase delays into the VCO ring. See, for example, the published international (PCT) patent application WO 03/063337A1 of Sheng et al. A realignment signal is obtained by combining the VCO circuit's clock output with a reference clock. This realignment signal is applied to one of the realignment inverters to force a transition at the reference clock edge. PLL circuits that use a phase-realigned VCO have reduced PM noise or jitter to significantly higher frequencies than comparable simple PLL circuits.

However, this technique also requires sophisticated digital gating and timing skewing between the VCO clock output, reference clock and realignment signal in order to apply the phase realignment at the optimum instant. The phase realignment factor, which is defined as the induced realignment phase shift divided by the difference between the VCO and reference phases just prior to the realignment instant, is hardly dependent on device performance spread and mismatch. The addition of realignment inverters adds phase delay to the VCO ring and thus decreases the VCO circuit's maximum operating frequency. The device parameters in any VCO circuit embodiment are specific to the design operating frequency, and hence this particular phase realignment technique is not applicable where a VCO circuit with a wide frequency range is desired.

DISCLOSURE OF THE INVENTION

The present invention uses parallel charge injection into each stage of a VCO circuit to apply a distributed and simultaneous phase shift to each stage in the ring at the instant the alignment is necessary. Short current impulses are applied simultaneously to each stage. These impulses induce a phase shift at the output of each stage relative to their phase angle before the realignment. The individual phase-shift obtained for each stage is dependent upon the instantaneous value of the impulse sensitivity response of that stage (a periodic function). Since different stages are at relatively different phases in the VCO ring, the obtained phase shifts from the individual stages will not necessarily be equal or even in the same direction. However, in the present invention, a multiphase impulse sensitivity response function that is characteristic for the VCO circuit as a whole is both strictly positive (or, strictly negative) and also relatively constant, so phase realignment is readily achieved without needing any special synchronization between the reference clock and the VCO internal signals or clock output.

BEST MODE OF CARRYING OUT THE INVENTION

Figure 1:
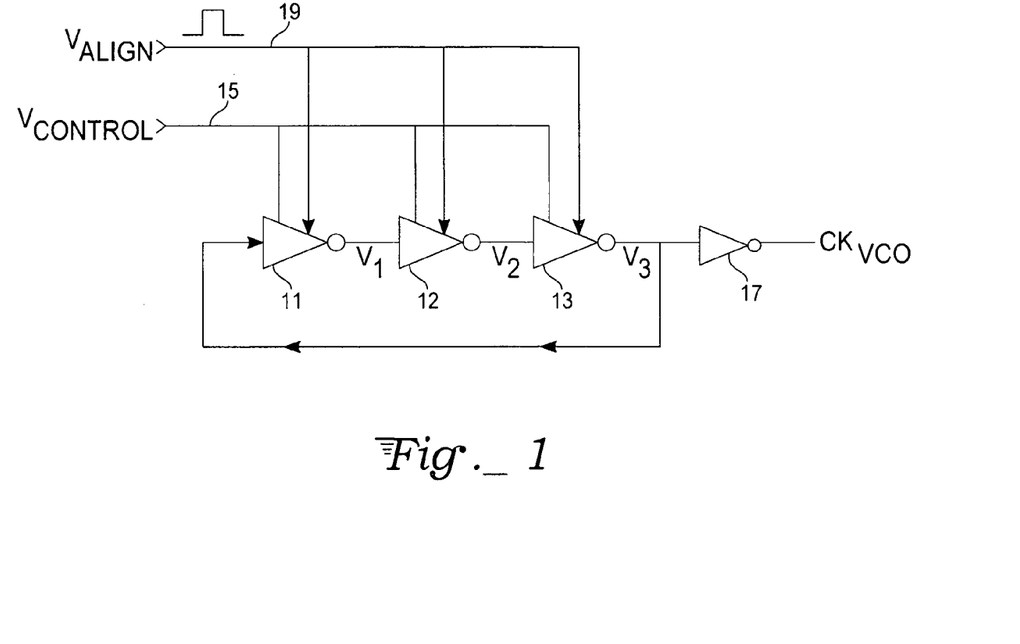
FIG. 1 is an exemplary basic schematic plan view of a multiphase realigned voltage-controlled oscillator of the present invention, here exemplified by a 3-stage ring oscillator.

With reference to FIG. 1, a three-stage ring VCO circuit includes a series of inverting stages 11, 12, and 13, with the output of the third stage 13 coupled back to the input of the first stage 11. Each of the stages 11, 12, and 13 outputs an oscillating voltage, $V_1$, $V_2$, and $V_3$, respectively, which will be essentially periodic over time.

The oscillation frequency of the output voltages, $V_1$, $V_2$, and $V_3$, depends on the propagation delay through one cycle of the ring and can be adjusted to a target frequency using a control voltage $V_{CONTROL}$ applied via a control input 15 to each of the stages 11, 12, and 13. The oscillating output voltages from the three stages will have relative phases that tend to be 120° apart (except immediately after a realignment impulse).

An output stage 17 is much smaller than the ring stages so that it saturates and generates a VCO clock output $CK_{VCO}$ that is essentially a square wave with the same frequency as that of the ring.

Each ring stage, 11, 12, and 13, also receives a short realignment pulse $V_{ALIGN}$ via a second control input 19 whenever phase realignment of the VCO output $CK_{VCO}$ is deemed necessary. In this way, realignment pulses are applied in parallel to all stages of the VCO ring, and the associated parallel charge injection into each stage which result from such pulses causes simultaneous and distributed phase shifts to each stage of the ring.

Figure 2:
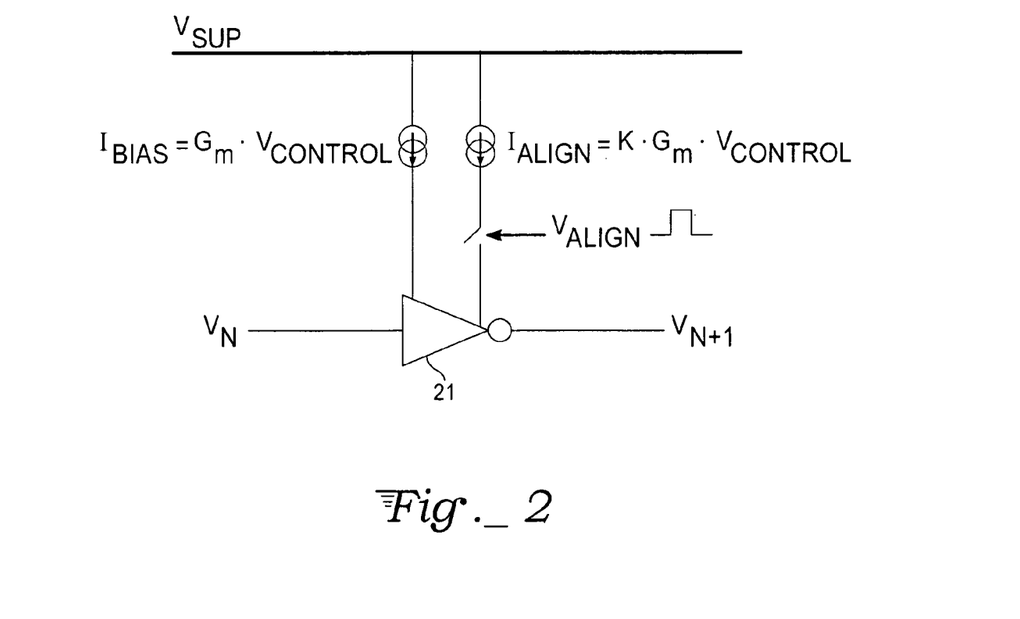
FIG. 2 is a basic schematic plan view of an individual stage of the oscillator of FIG. 1.

Referring to FIG. 2, each VCO ring stage 21 is characterized by a propagation delay or relative phase between its input $V_N$ and its inverted output $V_{N+1}$ that is proportional to total injected current. This includes a VCO bias current $I_{BIAS}$, which is proportional to the control voltage $V_{CONTROL}$, plus the additional contribution from the alignment current pulse $I_{ALIGN}$, which is switched on and off by the $V_{ALIGN}$ pulse. A circuit designer can optimize the relative amount of the realignment phase shift for a given output-to-reference clock phase difference by increasing the charge injection amplitude proportionally to the bias current $I_{ALIGN}/I_{BIAS}$ (represented by the factor k).

Figure 3:
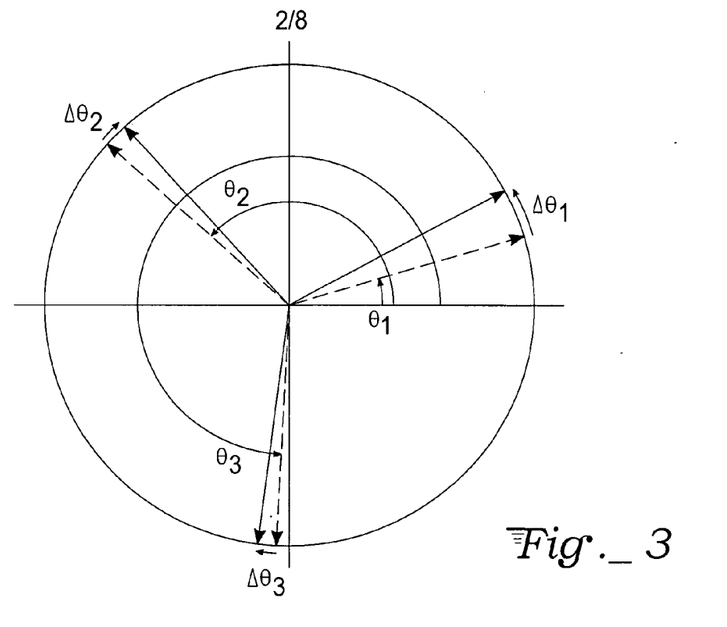
FIG. 3 is a phase diagram showing the phase shifts ($\Delta\phi$) of the individual stages due to a short current impulse injecting charge into each of the stages.
Figure 4:
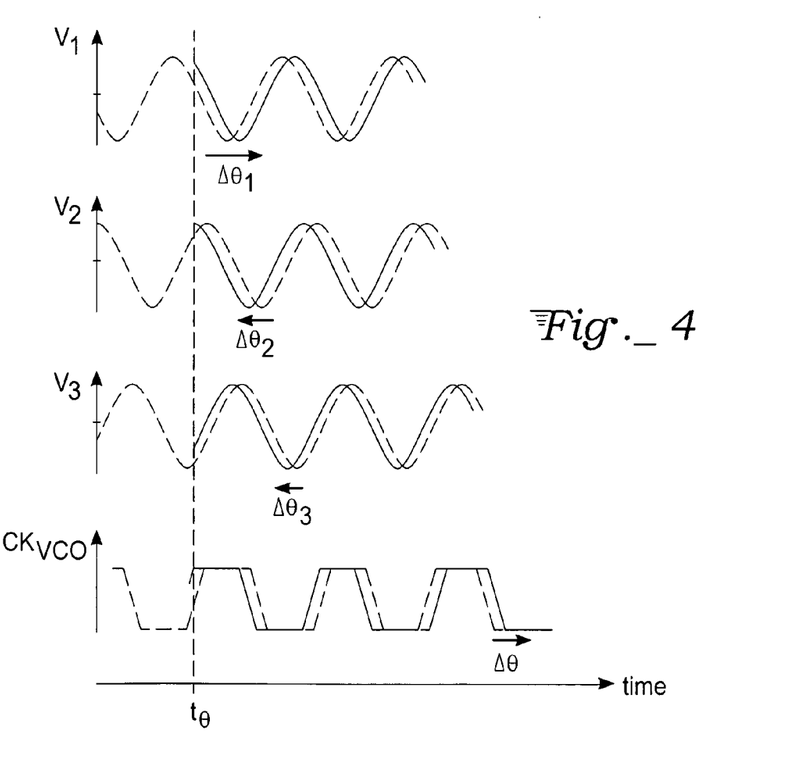
FIG. 4 is a graph of output voltage from each stage ($V_1$, $V_2$, $V_3$) versus time, where the dashed curves represent the voltages prior to realignment, both actual and extrapolated to after realignment, and where the solid curves represent the voltages after the realignment.

With reference to FIGS. 3 and 4, the three stages of the VCO ring tend to operate with a relative phase difference between them of 120°. Although the stages may deviate slightly from this tendency, particularly immediately after a phase readjustment, as the oscillating input and output voltages $V_1$, $V_2$, and $V_3$ propagate through the stages in the ring the relative phases will adjust so as to approach and then maintain themselves at or near 120°. In VCO rings with some other number of stages, the relative phases will differ, but will tend to equalize and cumulatively sum to 360° (e.g., a 72° relative phase difference between stages of a 5-stage ring). The dashed vectors in phase diagram of FIG. 3 and the relative displacement of the dashed sinusoidal curves in FIG. 4 illustrate this relative difference in the phases ($\phi_1$, $\phi_2$, $\phi_3$) of the outputs ($V_1$, $V_2$, $V_3$) from each stage prior to a phase realignment pulse. The VCO clock output CKVCO will be square-wave-like in form and will have a phase of its transitions that is slightly later than that of the zero crossings of the voltage output $V_3$ from third stage in the ring, due to a slight, but substantially constant, propagation delay in the output stage, as represented in FIG. 4.

A realignment impulse is applied at a time $t_0$ to all ring stages in parallel. This produces a distributed and simultaneous phase shift at the output of each stage in the ring. However, the phase shifts ($\Delta\phi_1$, $\Delta\phi_2$, $\Delta\phi_3$) from the different stages are not necessarily equal, nor even necessarily in the same direction, even if the stages are otherwise structurally identical, because they are at different relative phases at the time $t_0$ of the realignment impulse. For example, the immediate result of a phase realignment impulse, represented as solid vectors in the phase diagram of FIG. 3 and the solid sinusoidal curves in FIG. 4, show a case where the phase shift $\Delta\phi_1$ from the first ring stage is in a positive direction, while the phase shifts $\Delta\phi_2$ and $\Delta\phi_3$ from the second and third ring stages are in a negative direction, and where $\Delta\phi_1$ is relatively larger than either of $\Delta\phi_2$ or $\Delta\phi_3$. The particular result will vary depending upon the instant that the realignment pulse is applied. Nevertheless, the eventual result at the VCO clock output $CK_{VCO}$ will, after the oscillating voltage signal has had a chance to propagate through all stages of the ring and adjust toward a new 120° relative phase difference between the stages, be an average of the three individual phase shifts distributed among the three stages. In the example shown in FIG. 4, this is a slight positive phase shift $\Delta\phi$ in the VCO clock output $CK_{VCO}$.

The concept of an impulse sensitivity response function (ISF) that is a characteristic for each individual VCO ring stage can be adapted to arrive at a multiphase impulse sensitivity response function (MISF) for the VCO ring as a whole. The ISF for any given VCO ring stage at any given moment in time is defined as the ratio of the instantaneous phase shift produced at the VCO output divided by the relative to the charge quantity injected by the very short current impulse $I_{ALIGN}$ into that stage. The relative charge quantity is calculated by reference to the total charge swing exchanged between the stage and its load capacitance over one oscillation period. That is, $$ISF = (\Delta\phi/\Delta q) \cdot \phi i_L(t) dt,$$

where, $\Delta\phi$ is the induced phase shift at the VCO output, $\Delta q$ is the charge quantity injected into the VCO stage at the realignment instant, $i_L(t)$ is the load current of the stage, and the integration is over one entire oscillation period (0 to $T_0$).

Figure 5:
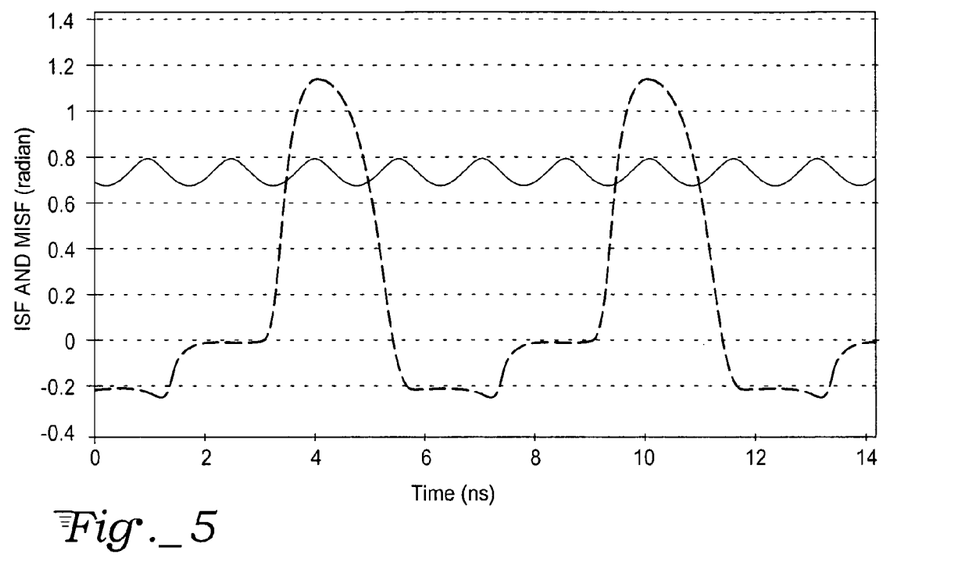
FIG. 5 is a graph of impulse sensitivity response functions (ISF and MISF) for an individual VCO ring stage (dashed curve) and for the entire VCO (solid curve), for the VCO circuit embodiment shown in FIG. 7.

The ISF is a periodic function having the same frequency as the VCO circuit's ring oscillation frequency. The sign of the ISF depends on the instant that the current impulse is applied. For example, it may be positive at rising signal slopes and negative at falling ones. However, the magnitude will usually not be the same for the positive and negative portions of the ISF curve. FIG. 5 shows an ISF of an individual stage (the dashed curve) for the VCO embodiment of FIG. 7. The ISF curves for the other two stages in a three-stage ring VCO will be substantially identical, but staggered in time by ⅓ of the ISF period.

The multiphase impulse sensitivity response function (MISF) is defined as the ratio of the overall phase shift of the VCO output clock divided by the relative charge quantity injected simultaneously by very short current impulses into all ring stages of the VCO. The equation given above for the ISF also applies to the MISF, except that $\Delta q$ is the total charge quantity injected into all of the ring stages. The MISF is also a periodic function, but its frequency equals the VCO frequency multiplied by the number of stages. However, the MISF will be either strictly positive or strictly negative, so that its sign does not vary depending on the injection instant. Moreover, the MISF magnitude will be fairly constant, so that the induced phase shift will also not vary much depending on the injection instant. FIG. 5 shows a strictly positive and quite constant MISF (solid curve) for the exemplary VCO embodiment described below. An advantage of a nearly constant MISF is that phase realignment can be realized without any special synchronization between the reference clock and the VCO internal signals or output clock. One does not really care at what instant during an oscillation cycle the realignment impulse is applied.

Figure 6:
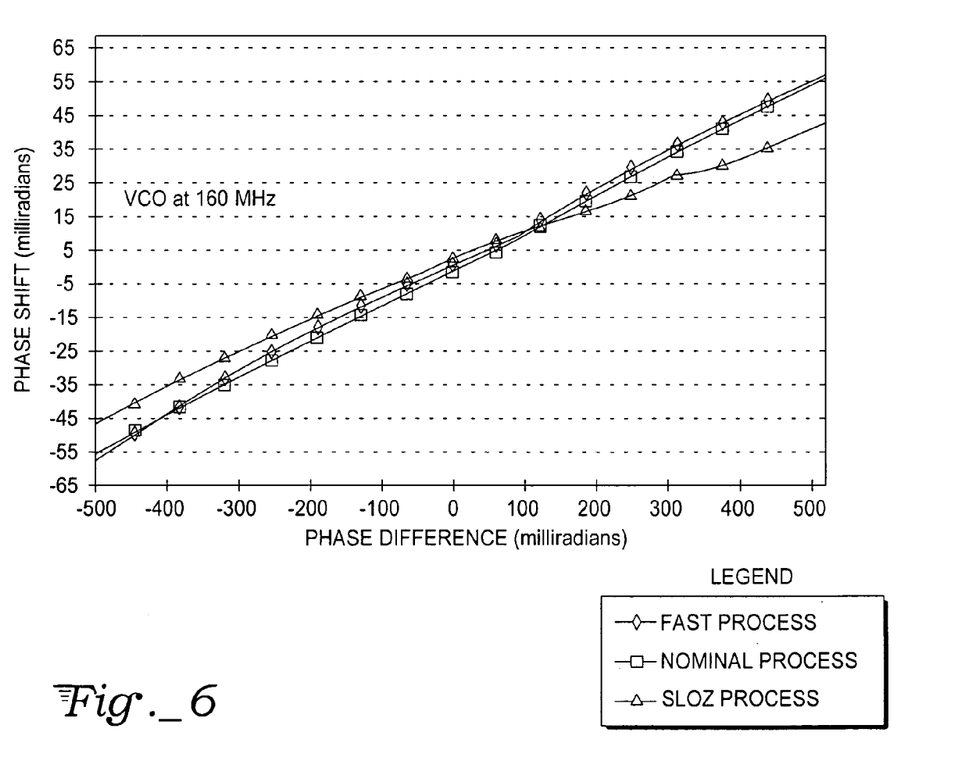
FIG. 6 is a graph of VCO output phase shift due to realignment, expressed in milliradians at 160 MHz, versus the phase error detected between the VCO clock output and a reference clock, for the VCO circuit embodiment shown in FIG. 7.

With reference to FIG. 6, the output phase shift due to realignment is a continuous and linear function of the detected phase error between the VCO output clock and a reference clock. The linear functions graphed in FIG. 6 are for an operating frequency of 160 MHz. The slope of each relationship is a realignment factor $\beta$. If $\Delta\phi$ represents the relative phase shift of the output clock $CK_{VCO}$ induced by a multiphase charge injection into the VCO ring stages, and $\Delta\theta$ represents the phase error prior to the realignment, then we can define a realignment factor $\beta=\Delta\phi/\Delta\theta$. The issue with the realignment factor arises in wide frequency range VCO circuits from the fact that its value tends to be dependent to some extent upon the VCO operating frequency. The use of the multiphase realignment technique of the present invention allows matching of the relative charge injection quantity with the VCO bias current, which results in a more stable amplitude of $\beta$ over a wide frequency range. The realignment factor $\beta$ is controlled by increasing the realignment pulse amplitude $I_{ALIGN}$ proportionally to the VCO bias current $I_{BIAS}$ (=$G_m \cdot V_{CONTROL}$). FIG. 6 illustrates that we can keep the realignment factor $\beta$ relatively constant over a range of fabrication processes, from fast to slow.

Figure 7:
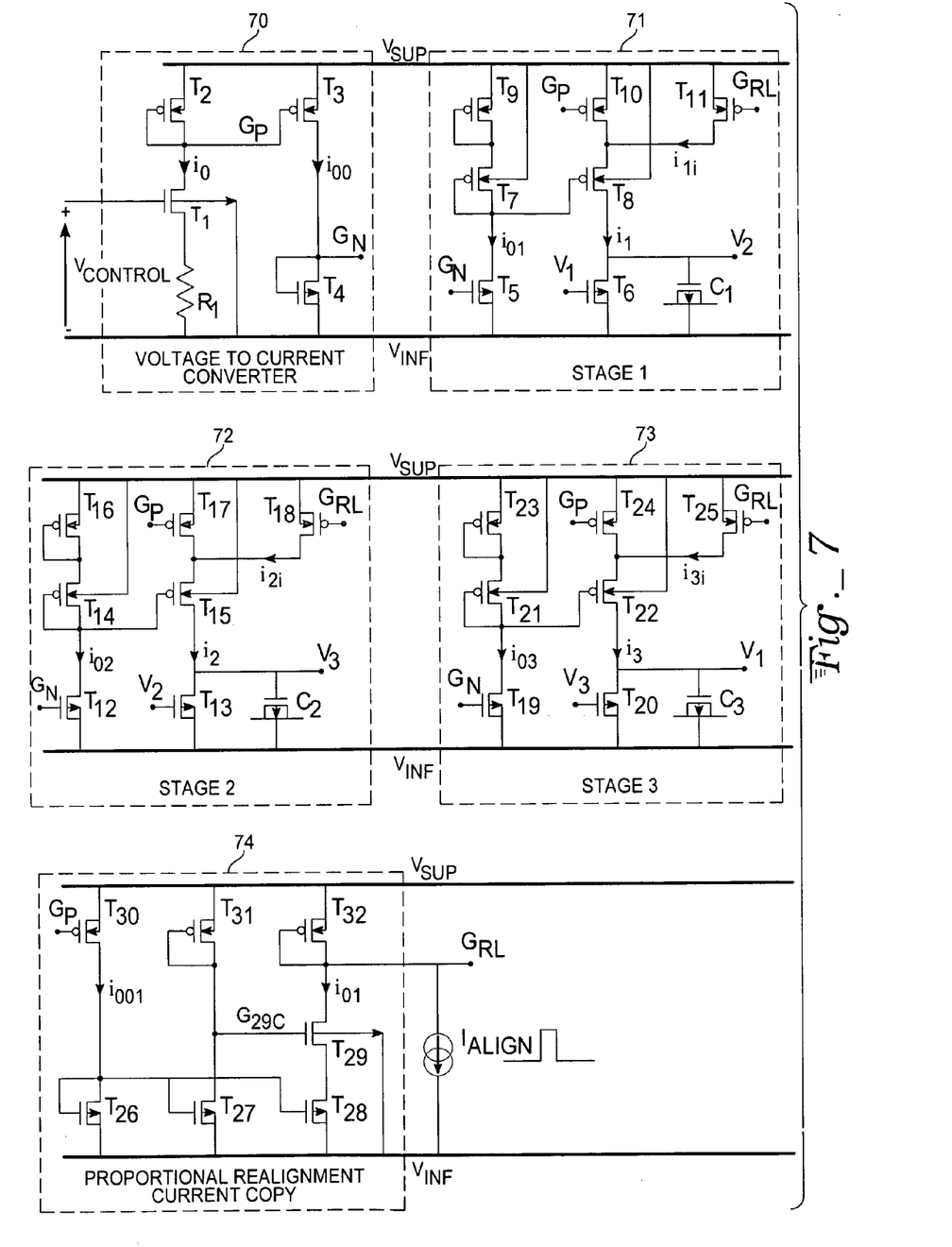
FIG. 7 is an exemplary transistor-level schematic circuit diagram of an exemplary VCO circuit embodiment in accord with the present invention.
Figure 8:
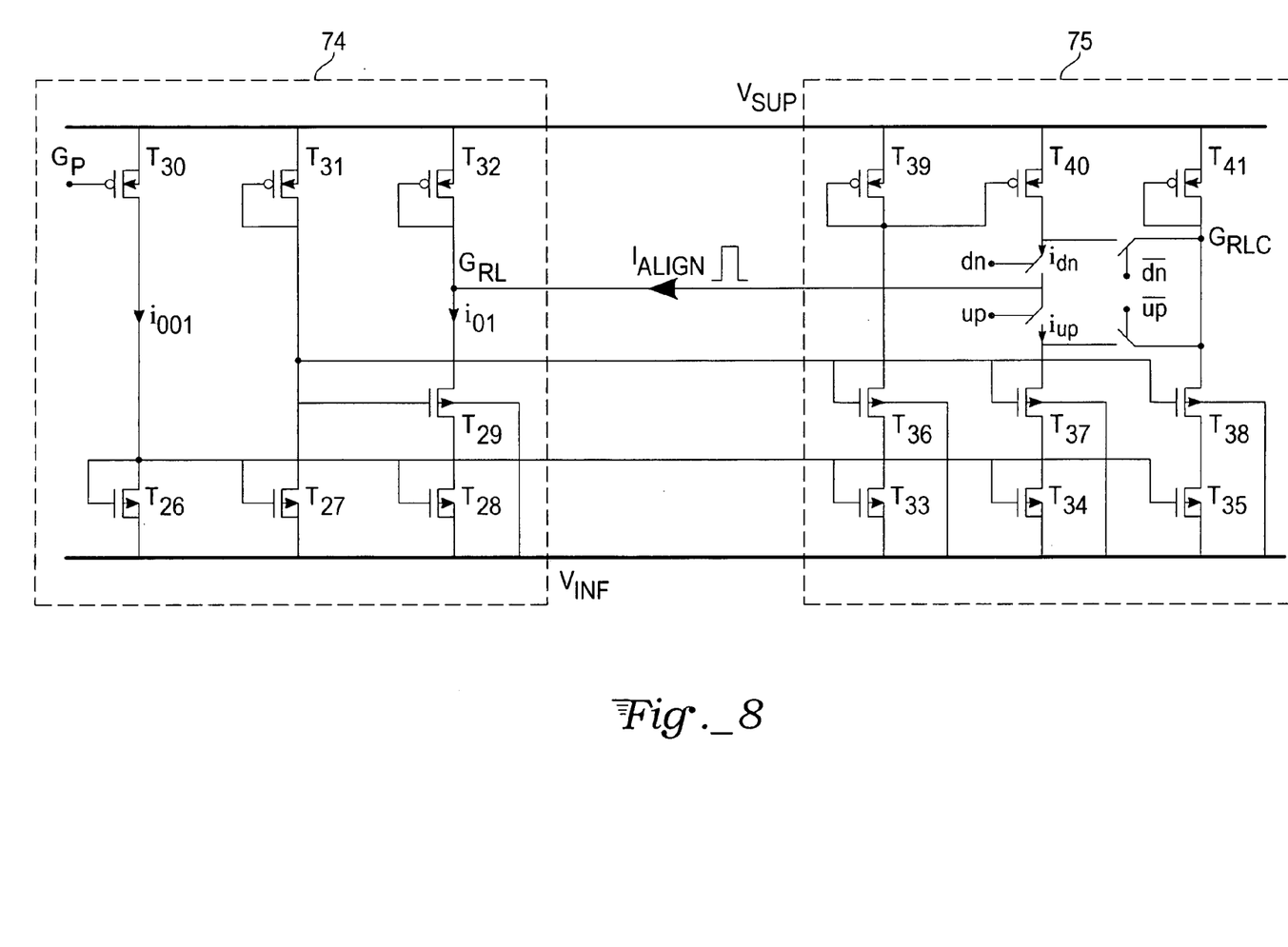
FIG. 8 shows an exemplary phase detector and charge pump circuit for providing the proportional injection $I_{ALIGN}$ to the ring VCO of FIG. 7.

FIG. 7 shows an exemplary embodiment of a VCO circuit in accord with the present invention. What is shown is a more detailed example of the ring VCO in FIG. 1. The number of ring stages can be varied. This embodiment is based on cascoded NMOS inverter stages. One could, if desired, modify this embodiment to use CMOS inverter stages, but the resulting VCO would be slower and more sensitive to ripple in the supply voltage $V_{SUP}$. The present invention could also be constructed using bipolar or other integrated circuit types. In another variation, one might inject the realignment current differentially instead of using $I_{ALIGN}$ pulses. The distributed charge injection technique of the present invention might also be applied to stages of an LC oscillator, instead of the one shown here that uses inverter stages. FIG. 8 shows an exemplary phase detector and charge pump circuit for providing the proportional injection $I_{ALIGN}$ to the ring VCO of FIG. 7.

In FIG. 7, a voltage-to-current converter 70 receives a control voltage $V_{CONTROL}$ at the gate of NMOS transistor T1 for controlling the oscillating frequency of the VCO circuit. The resistor R1 converts $V_{CONTROL}$ minus the threshold voltage of transistor T1 to a proportional current $i_0$. In a specific embodiment, transistor T1 has a large gate channel width/length ratio and works slightly above the threshold region. Transistors T2, T3, and T4 form mirror current reference devices for establishing gate voltages $G_P$ and $G_N$ to be applied to matching transistors in the VCO ring stages 71, 72, and 73. PMOS transistors T2, T3, T10, T17, and T24 are matched to each other and share the same source and gate voltages, $V_{SUP}$ and $G_P$. Likewise, NMOS transistors T4, T5, T12, and T19 are matched to each other and share the same source and gate voltages $V_{INF}$ and $G_N$. In this way, currents $i_1$, $i_2$ and $i_3$ will be matched to the reference current $i_0$ established by $V_{CONTROL}$, and the bias currents $i_{01}$, $i_{02}$, and $i_{03}$ will match the corresponding current $i_{00}$ in the voltage-to-current converter 70. The gate channel widths and lengths are chosen to be large enough to obtain good matching.

The drain voltages of the PMOS transistors T10, T17, and T24 in the stages 71, 72, and 73 are made stable owing to the cascode transistors T8, T15, and T22. These cascode transistors have a gate voltage that follows the variations in the supply voltage $V_{SUP}$, which improves the power supply rejection ratio of the VCO circuit. The $V_{SUP}$-to-gate voltage of cascode transistor T8 is determined by the sum of the gate-to-source voltages of transistors T7 and T9 biased by the current $i_{01}$ (matched to $i_{00}$). The $V_{SUP}$-to-gate voltages of cascode transistors T15 and T22 are determined in the same manner, with transistors T14, T16, T21, and T23. The fact that transistors T10, T17, and T22 can be slow (due to their large channel lengths to ensure good matching with T2) does not impact the VCO speed. This rather depends on the speed of the cascode transistors T8, T15, and T22. Accordingly, these cascode transistors have the shortest channel length for fast operation.

Capacitors C1, C2, and C3 in the inverting stages 71, 72, and 73 are used for tuning the VCO frequency range.

A proportional realignment current copy subcircuit 74 provides a realignment voltage input $G_{RL}$ by means of a PMOS transistor T32 to realignment current copy transistors T11, T18, and T25 in the inverter stages 71, 72, and 73. The realignment currents $i_{1i}$, $i_{2i}$, and $i_{3i}$ through the transistors T11, T18, and T25 are copies of the current $i_{0i}$ through transistor T32. However, the precise matching of transistors T11, T18, and T25 to transistor T32 is not critical, since the multiphase impulse sensitivity response function (MISF) is not very sensitive to small differences in the realignment currents. Indeed, this low sensitivity is good from a design standpoint, because the current copy transistors T11, T18, T25, and T32 need to be made with the shortest gate length and the smallest possible gate width in order to be able to copy the very short current pulses $I_{ALIGN}$.

The realignment current $i_{0i}$ has both a DC contribution copied from mirrored NMOS transistors T26 and T28 ($i_{00i}$) and a pulsed contribution $I_{ALIGN}$ delivered by a charge pump. Both contributions are proportional to the VCO bias current $i_0$ established in the voltage-to-current converter 70. This allows one to realize a small-spread realignment factor $\beta$ versus the VCO bias current $i_0$ and thus versus its operating frequency. The DC component $i_{00i}$ may typically equal about 20% of $i_0$, while the pulsed component $I_{ALIGN}$ may typically equal about 10% of $i_0$. A realignment phase detector and charge pump 75, described below with reference to FIG. 8, provides $I_{ALIGN}$, which is a positive pulse whenever the VCO output phase is less than (lags) the reference phase, and a negative pulse whenever the VCO output phase is greater than (leads) the reference phase. This realignment pulse causes the phase of the VCO clock output to be accelerated or decelerated, as needed, so as to align the VCO clock output with the reference clock.

Finally, an NMOS cascode transistor T29 is coupled to the transistor T28 in the current copy subcircuit 74 in order to reduce the parasitic charge injection induced by the intrinsic output capacitances $C_{gd}$ and $C_{ds}$ of transistor T28. Like the other current copy transistors T11, T18, T25, and T32, the cascode transistor T29 also is made with the shortest gate length and smallest possible gate width in order to quickly respond to the very short $I_{ALIGN}$ current pulses.

With reference to FIG. 8, the proportional realignment current copy subcircuit 74 receives the $I_{ALIGN}$ current pulses from a phase detector and charge pump subcircuit 75. As already noted, the amplitude of the pulses should be proportional to the VCO bias current $i_0$. The sign should be positive when the VCO output phase is smaller than (lags) the reference clock phase. The pulse width should equal the time delay between the VCO output clock edge and the reference clock edge. In FIG. 8, a conventional phase-frequency detector circuit (PFC), not shown, but well known in the art, provides the up and down signals, up and dn, and their complements, to a set of switches, which open or close according to the state transition diagram in FIG. 9 and the signal waveform diagram in FIG. 10. Any PFC circuit that operates as in FIGS. 10 and 11, can be used. For example, the PFC circuit could be implemented using RS flip-flops based on elementary NAND gates.

The transistors T33 through T41 constitute the impulse charge generator which selectively couple the supply lines $V_{SUP}$ and $V_{INF}$ to the realignment pulse line $G_{RL}$ by the up and down signals to generate the realignment pulses $I_{ALIGN}$. Whenever signal up is high and dn is low, the current $i_{up}$ through transistors T37 and T34 is driven to node $G_{RL}$, while the current $i_{dn}$ through transistor T40 is driven to a waste node $G_{RLC}$. This increases the current through transistor T32 and thus injects a positive current pulse into all of the VCO stages 71, 72, and 73 via copy transistors T11, T18, and T25, instantly accelerating the VCO. Oppositely, whenever the signal up is low and dn is high, the current $i_{dn}$ is driven to node $G_{RL}$, while $i_{up}$ is driven to the waste node $G_{RLC}$. This decreases the current through transistor T32 and thus injects a negative current pulse into all of the VCO stages 71, 72, and 73 via the copy transistors T11, T18, and T25, instantly decelerating the VCO.

The magnitudes of the currents $i_{up}$ and $i_{dn}$ are both about equal to one-half of the magnitude of the current $i_{0i}$. The transistors T33, T34, and T35 are all matched in their gate channel lengths with transistor T26, but their gate widths are designed so as to ensure the current magnitudes are approximately $i_{up} = i_{dn} = \frac{1}{2} \cdot i_{0i}$. Cascode transistors T36, T37, and T38 for the respective transistors T33, T34, and T35 minimize any parasitic charge injection due to the up and down switches.

Figure 9:
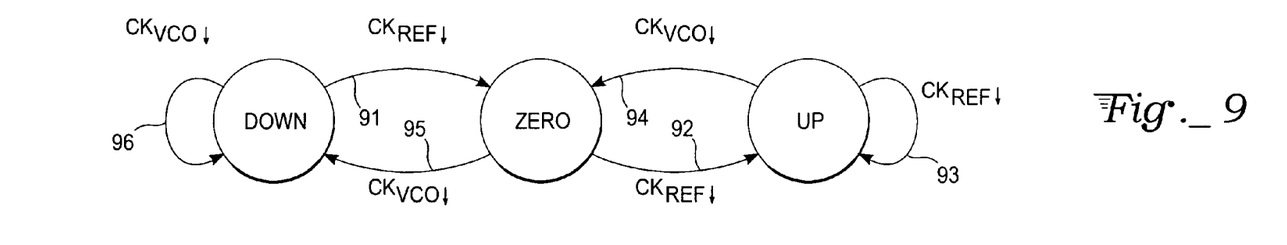
FIG. 9 is a state transition diagram for a phase-frequency detector circuit (PFC) state machine providing the complementary up and down signals to the switches in the charge pump circuit of FIG. 8.
Figure 10:
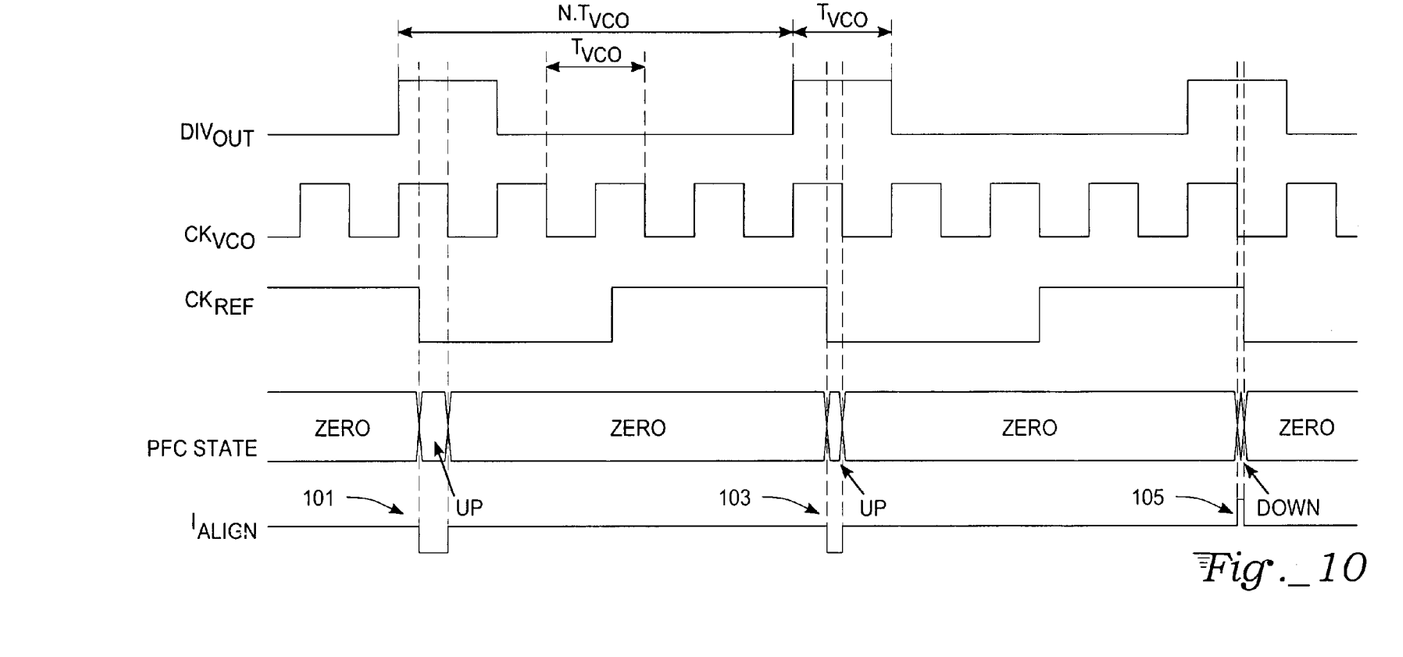
FIG. 10 is a signal waveform diagram for the PFC state machine responsive to the VCO clock output $CK_{VCO}$ and reference clock $CK_{REF}$ to generate in the charge pump circuit a positive or negative current impulse $I_{ALIGN}$ of appropriate width.

With reference to FIGS. 9 and 10, an exemplary phase-frequency detector circuit that can be used with the present invention may be sensitive to the falling edges of the VCO clock output $CK_{VCO}$ and of the reference clock $CK_{REF}$. $CK_{VCO}$ may be masked by a signal $CK_{DIV}$, which represents the frequency subdivision of $CK_{VCO}$ obtained by a digital frequency divider working on $CK_{VCO}$'s rising edge, as illustrated in FIG. 10. The phase detection is then made only after each N VCO clock periods, or one reference clock period, where N is the multiplication factor between the VCO output clock frequency and the reference clock frequency.

At each falling edge of $CK_{REF}$: (a) if the existing PFC state is DOWN, then the PFC transits (91) to state ZERO; (b) if the existing PFC state is ZERO, the PFC transits (92) to state UP; and (c) if the PFC state is UP, then the PFC keeps the same state (93). At each falling edge of $CK_{VCO}$, while $CK_{DIV}$ is high: (a) if the existing PFC state is UP, then the PFC transits (94) to state ZERO; (b) if the existing PFC state is ZERO, then the PFC transits (95) to state DOWN; and (c) if the existing PFC state is DOWN, the PFC keeps the same state (96). In state ZERO, signals up and dn are both reset low to 0. In state UP, signal up is set high to 1, while signal dn is reset low to 0. In state DOWN, signal up is reset low to 0, while signal dn is set high to 1. As already noted, the up and dn signals determine the current impulse $I_{ALIGN}$ generated by the charge pump circuit 75 in FIG. 8.

Resulting waveforms can be seen in FIG. 10. Note that the width of the current impulse $I_{ALIGN}$ is proportional to the phase difference between $CK_{VCO}$ and $CK_{REF}$, being wider, for example, at phase detection event 101 than at either events 103 or 105. Where the current impulse is negative (e.g. at 101) due to an UP event, the VCO phase is accelerated, which provides a shorter duration UP state at the next phase detection 103, and eventually a DOWN state at detection event 105. The current impulse is positive (e.g. at 105) due to a DOWN event, causing the VCO phase to decelerate. In this manner, the VCO output clock phase continuously tends toward the phase of the reference clock $CK_{REF}$.

Figure 11:
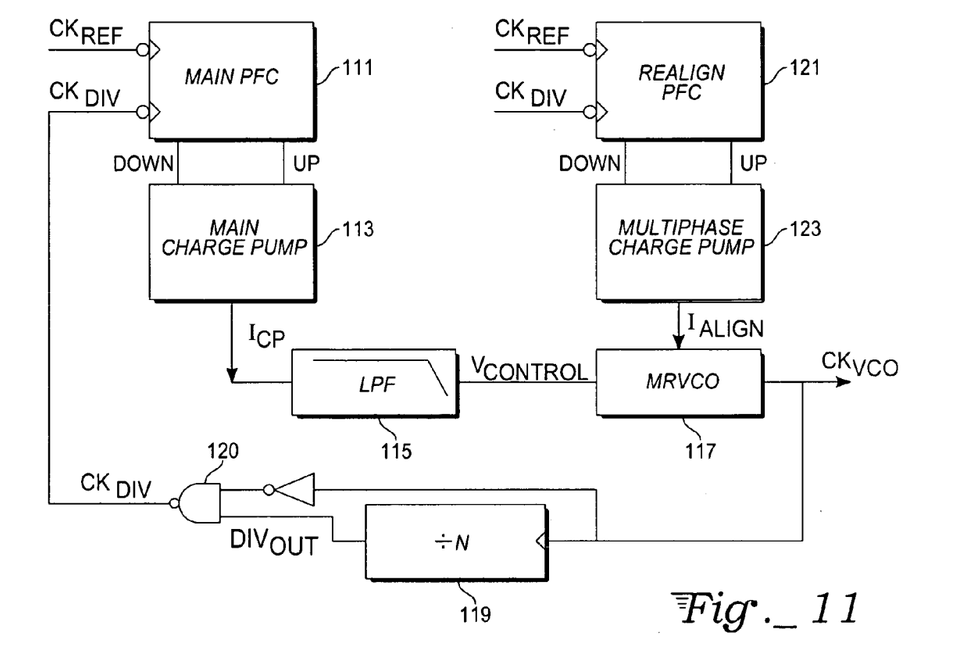
FIG. 11 is a schematic block diagram of a PLL circuit employing a multiphase realigned VCO circuit of the present invention in the loop.

With reference to FIG. 11, the multiphase realigned VCO circuit of the present invention may be employed in a phase-locked loop (PLL) circuit, resulting in a significant reduction in phase noise or jitter. The multiphase realigned PLL circuit uses a principal loop comprising a main phase-frequency detection circuit (PFC) 111, a main charge pump 113, a low pass filter 115, a multiphase realigned VCO circuit 117 like that described above, and a divide-by-N frequency divider 119. The PLL circuit also includes a second PFC 121 and a realignment charge pump 123 in order to feed the VCO circuit 117 with the realignment current impulse $I_{ALIGN}$. Both PFC circuits 111 and 121 act at the falling edges of signals $CK_{REF}$ and $CK_{DIV}$, as in FIGS. 9 and 10, which means, taking into account the signal gating using the NAND gate 120, that they directly detect the phase difference between the reference clock signal $CK_{REF}$ and the $N^{th}$ clock edge of the VCO clock output $CK_{VCO}$. The use of two separate PFC circuits 111 and 121 and two separate charge pumps 113 and 123 allow mutual phase correction mechanisms: (a) a primary phase regulation ($V_{CONTROL}$) at low speed for the main loop, via main PFC and charge pump circuits 111 and 113, and (b) a feed-forward phase correction ($I_{ALIGN}$), via the multiphase realignment PFC and charge pump circuits 121 and 123.

Figure 12:
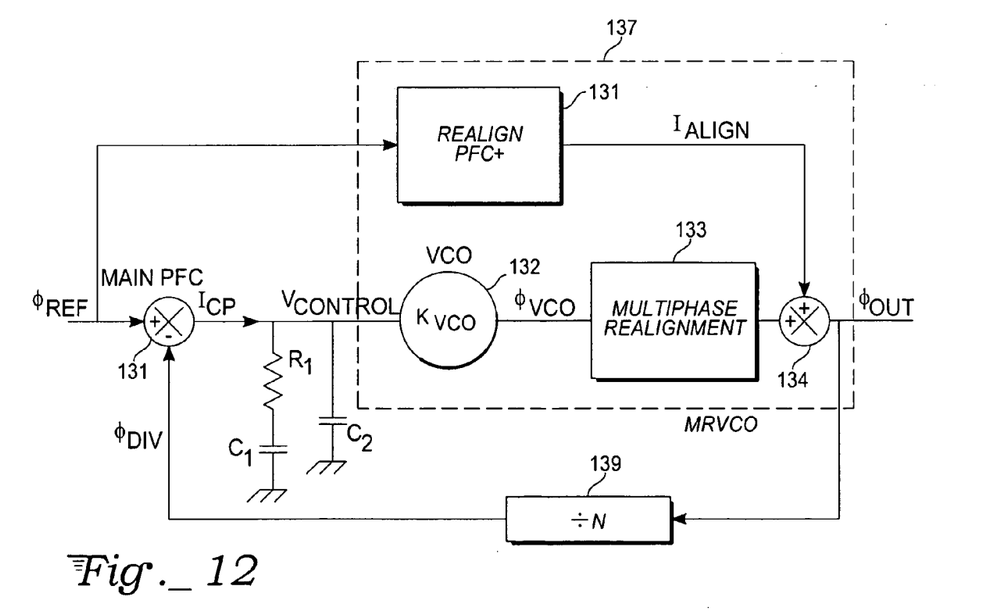
FIG. 12 is a linear phase model of the PLL circuit in FIG. 11 for use in estimating phase modulation noise.

With reference to FIG. 12, in an equivalent synoptic model for the multiphase realigned PLL circuit of FIG. 11, the signals are replaced by their absolute phases in order to illustrate the impact of the phase regulation loop on the final PLL phase noise. The phase summing node 131 represents the main PFC circuit 111 and associated main charge pump 113 to provide a low-frequency charge pump output current $I_{CP}$ that depends on the phase relationship ($\phi_{REF} - \phi_{DIV}$) between the divided VCO output and reference clocks. The low pass filter 115 is represented by a resistor R1 and two capacitors C1 and C2, and provides a $2^{nd}$ order phase advance correction that results in the control voltage $V_{CONTROL}$. An alternate filter architecture using a simple integrator and a single capacitor could be used instead. The multiphase realigned VCO circuit 117 and associated realignment PFC circuit 121 and charge pump 123 are represented by the phase elements 131 through 134 inside dashed box 137. While the low-frequency $V_{CONTROL}$ signal in the main loop provides long-term frequency and phase stability to the VCO (i.e., over multiple cycles); $I_{ALIGN}$ pulses from the multiphase realignment PFC and charge pump components provide instant phase changes to the VCO output whenever needed, as represented by the phase summation node 134. In the main loop, the VCO output phase $\phi_{OUT}$, when divided by the divide-by-N component 119, represented by phase element 139, generates the $\phi_{DIV}$ phase that is used for comparison with $\phi_{REF}$ in the main PFC circuit.

Figure 13:
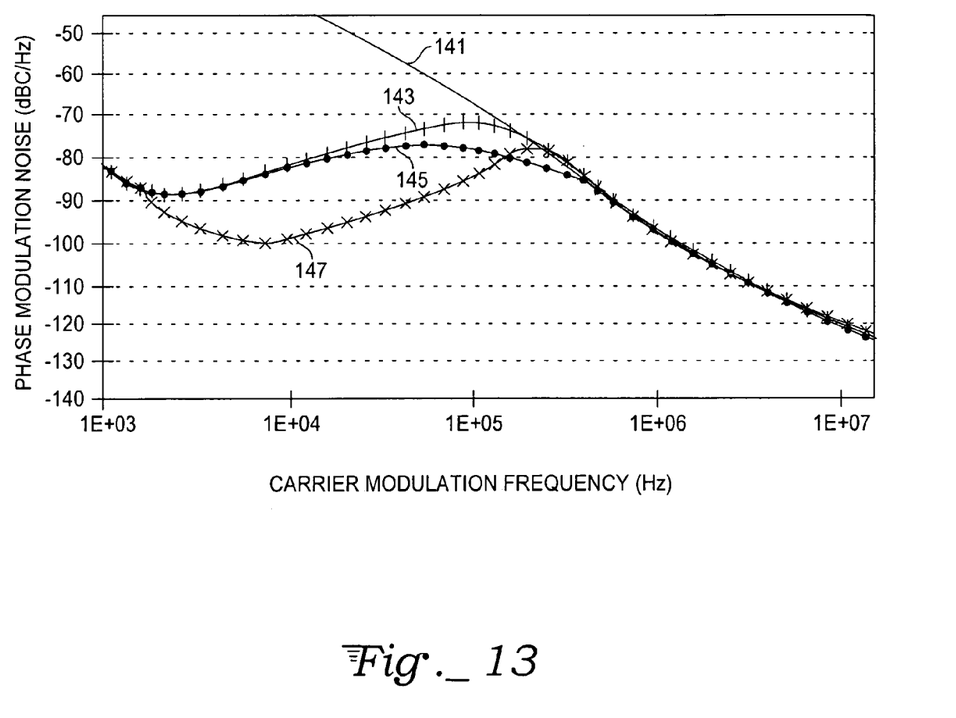
FIG. 13 is a graph of phase modulation noise (in dBc/Hz) versus carrier modulation frequency (in Hz) for a multiphase realigned VCO circuit as in FIG. 7, for a representative PLL circuit of the prior art without multiphase realignment, and multiphase realigned PLL circuits as in FIGS. 11 and 12 with various low-pass filters and characterized by a small (0.1) realignment factor $\beta$.

Using this phase model, the VCO phase noise versus modulation frequency around a carrier can be estimated by a simulator employing a periodic steady state method. FIG. 13 shows results for such phase noise estimation for the PLL circuit of FIGS. 11 and 12, where the phase modulation noise is expressed by a single sideband spectral power density in dBc/Hz relative to carrier signal power. For reference, the nearly linear curve 141 estimates the intrinsic phase modulation noise of the multiphase realigned VCO of the present invention, by itself. The curve 143 shows the estimated phase noise for a PLL without the phase realignment of the present invention. The curve 145 shows the estimated phase noise for a multiphase realigned PLL circuit as in FIGS. 11 and 12, using a (R1, C1, C2) low-pass filter, but with a very small (0.1) realignment factor β. Note that even with this small β, there is an improvement of up to 5 dB over prior PLL circuits. For any PLL circuit of this type, the realignment factor can be optimized for lowest phase noise using such simulations. Curve 147 shows the estimated phase noise for a multiphase realigned PLL circuit as in FIG. 11 using a simple integrating capacitor C2 as the low-pass filter. The significant noise improvement shows that with the multiphase realigned VCO in the loop it is no longer necessary to use a zero-phase correction (R1-C1) in such PLL circuits. The simple integrating capacitor allows better performance without degrading the stability conditions of the loop due to the feed-forward realignment.

What is claimed is:

1. A multiphase-realigned voltage-controlled oscillator (VCO) circuit, comprising:
    a plurality of inverting stages coupled together in series into a ring, each of these inverting stages in the ring providing an oscillating voltage signal to the next stage in the ring with a relative phase delay between the stages automatically adjusting itself according to the number of stages in the ring, each inverting stage in the ring responsive to a control voltage input to provide a long-term adjustment of propagation time delay through each inverting stage in the ring and hence adjusting the oscillating frequency of the ring to a target frequency; and
    an output stage coupled to an output of one of the inverting stages, the output stage configured to provide a VCO clock output;
    wherein each of the inverting stages in the ring is further coupled to receive in parallel a realignment current impulse, these inverting stages responsive to said realignment current impulse effective to immediately shift the phase of the oscillating voltage signal output from each stage, whereby an overall phase realignment of the VCO clock output is achieved after a relative phase readjustment between the stages.

2. The VCO circuit as in claim 1, further comprising:
    a phase detector circuit receiving and comparing a stable reference clock signal and the VCO clock output, the phase detector circuit providing up/down control signals in accord with a result of the comparison; and
    a charge pump circuit receiving the up/down control signals from the phase detector circuit and producing the realignment current impulse.

3. The VCO circuit of claim 2, wherein the realignment current impulse has a peak amplitude proportional to the control voltage, has a positive or negative sign that is dependent upon whether the VCO clock output lags or leads the reference clock signal, and has a pulse width corresponding to the relative phase difference between the reference clock signal and the VCO clock output, whereby a substantially constant realignment factor is obtained for each realignment current impulse.

4. The VCO circuit of claim 1 wherein each of the inverting stages comprises a cascoded NMOS inverter.

5. The VCO circuit of claim 4 wherein a voltage-to-current converter receives the control voltage and supplies a mirrored bias current $i_O$ proportional to said control voltage to each of the cascoded NMOS inverters.

6. The VCO circuit of claim 5 wherein a realignment current copy subcircuit receives the realignment current impulse and provides copies thereof to current copy transistors within the cascoded NMOS inverter, such that the copied realignment current impulse is superimposed upon the mirrored bias current $i_O$.

7. A multiphase-realigned voltage-controlled oscillator (VCO) circuit, comprising:
    a plurality of inverting stages coupled together in series into a ring, each of these inverter stages configured to provide an oscillating voltage signal to the next inverting stage in the ring with a relative phase delay between the stages automatically adjusting itself according to the number of stages in the ring;
    a voltage-to-current converter coupled to receive a control voltage input and provide a mirrored bias current to each of the inverter stages to establish a propagation time delay through each inverter stage, and hence, establishing an oscillation frequency of the ring at a target frequency;
    an output stage coupled to an output of one of the inverter stages of the ring, the output stage configured to provide a VCO clock output;
    a phase detector coupled to receive and compare the phase of a stable reference clock signal with the VCO clock output and provide up/down control signals that are dependent upon whether the VCO clock output lags or leads the reference clock signal;
    a charge pump coupled to receive the up/down control signals from the phase detector and operative to produce a realignment current impulse corresponding to the phase delay between the VCO clock output and the reference clock signal; and
    a realignment current copy subcircuit coupled to receive the realignment current impulse from the charge pump and to provide copies thereof in parallel to current copy transistors within each of the inverter stages, such that within each inverter stage of the ring the copied realignment current impulse is superimposed upon the mirrored bias current effective to immediately shift the phase of the oscillating voltage signal output from each stage, whereby an overall phase realignment of the VCO clock output is achieved after a relative phase readjustment between the stages.

8. The VCO circuit of claim 7 wherein the voltage-to-current converter comprises:
    a first resistor, a first NMOS transistor and a second PMOS transistor coupled in series between power supply lines, with a gate of the first NMOS transistor receiving the control voltage input to conduct a first bias current, and with a gate-to-drain connection for the second PMOS transistor establishing a first mirror control voltage; and
    a third PMOS transistor and a fourth NMOS transistor coupled in series between the power supply lines, with a gate of the third PMOS transistor coupled to receive the first mirror control voltage to conduct a second bias current, and with a gate-to-drain connection for the fourth NMOS transistor establishing a second mirror control voltage;
    wherein each inverter stage has a PMOS transistor matching said second PMOS transistor and receiving the first mirror control voltage at its gate to conduct a mirror of the first bias current, and wherein each inverter stage also has an NMOS transistor matching the fourth NMOS transistor and receiving at its gate the second mirror control voltage to conduct a mirror of the second bias current, whereby each inverter stage is responsive to the control voltage input.

9. The VCO circuit of claim 8 wherein each inverter stage is a cascoded NMOS inverter stage which comprises:

fifth and sixth NMOS transistors, seventh through eleventh PMOS transistors, and a capacitor;

wherein the fifth NMOS and the seventh and ninth PMOS transistors are coupled in series between the power supply lines, with the fifth NMOS transistor being matched to the fourth NMOS transistor of the voltage-to-current converter and having a gate coupled to receive the second mirror control voltage such that a mirror of the second bias current flows therethrough, and with a gate-to-drain connection for each of the seventh and ninth PMOS transistors;

wherein the sixth NMOS and eighth and tenth PMOS transistors are coupled in series between the power supply lines, with the tenth PMOS transistor matched to the second and third PMOS transistors of the voltage-to-current converter and having a gate coupled to receive the first mirror control voltage such that a mirror of the first bias current flows therethrough, with the eighth PMOS transistor having a gate coupled to gate-to-drain connection of the seventh PMOS transistor, and with the sixth NMOS transistor having a gate coupled to receive, as an input of the inverter stage, an oscillating voltage signal output from a preceding inverter stage of the ring, the sixth NMOS transistor also having a drain providing an oscillating voltage signal as an output of the inverter stage, with the capacitor coupled between the drain and source of the sixth NMOS transistor; and wherein the eleventh PMOS transistor comprises a current copy transistor with a gate coupled to the realignment current copy subcircuit such that a copy of the realignment current impulse conducts through said eleventh PMOS transistor, with a drain of the eleventh PMOS transistor coupled to the drain of the tenth PMOS transistor such that within the inverter stage the copied realignment current impulse is superimposed upon the mirrored first bias current effective to immediately shift the phase of the oscillating voltage signal output of the inverter stage at the drain of the sixth NMOS transistor.

10. A multiphase-realigned phase-locked loop (PLL) circuit, comprising:

a multiphase-realigned voltage-controlled oscillator (VCO) circuit of the ring type, operative to provide an oscillating clock output that is responsive both to a control voltage input to provide long-term adjustment of an oscillating frequency and also to a realignment current impulse applied in parallel to all ring stages of the VCO circuit to effect an immediate phase realignment within the ring stages and an overall phase realignment of the VCO clock output;

a divide-by-N circuit coupled to receive the VCO clock output and act upon VCO clock edges to generate a divided clock signal of $1/N^{th}$ frequency relative to the VCO clock output;

a main phase-frequency detection circuit configured to compare an average frequency of the divided clock signal with that of a stable reference clock over many clock cycles and to generate long-term up/down control signals as a result of such comparison; and a main charge pump and a low pass filter configured to produce the control voltage input to the VCO circuit in response to the long-term up/down control signals.

11. The PLL circuit of claim 10 further comprising:

a second phase-frequency detection circuit comparing the relative phase of the divided clock signal with that of the stable reference clock to generate phase realignment up/down control signals as a result of such comparison; and a realignment charge pump producing realignment current impulses in response to the realignment up/down control signals.

12. The PLL circuit of claim 11, wherein the realignment current impulse has a peak amplitude proportional to the control voltage input, has a positive or negative sign that is dependent upon whether the divided clock signal lags or leads the reference clock signal, and has a pulse width corresponding to the relative phase difference between the reference clock signal and the divided clock signal, whereby a substantially constant realignment factor is obtained for each realignment current impulse.

13. The PLL circuit of claim 10, wherein the multiphase-realigned VCO circuit comprises:

a plurality of inverting stages coupled together in series into a ring, each of these ring stages providing an oscillating voltage signal to the next stage in the ring with a relative phase delay between the stages automatically adjusting itself according to the number of stages in the ring, each ring stage responsive to a control voltage input for providing a long-term adjustment of propagation time delay through each ring stage and hence adjusting the oscillating frequency of the ring to a target frequency; and an output stage coupled to an output of one of the ring stages, the output stage configured to provide a VCO clock output;

wherein each of the ring stages is further coupled to receive in parallel a realignment current impulse, the ring stages responsive to said realignment current impulse effective to immediately shift the phase of the oscillating voltage signal output from each stage, whereby an overall phase realignment of the VCO clock output is achieved after a relative phase readjustment between the stages.

* * * * *